United States Patent [19]

Taniguchi et al.

[11] Patent Number: 5,380,349
[45] Date of Patent: Jan. 10, 1995

[54] MOLD HAVING A DIAMOND LAYER, FOR MOLDING OPTICAL ELEMENTS

[75] Inventors: Yasushi Taniguchi, Kawasaki; Keiji Hirabayashi, Tokyo; Keiko Ikoma, Yokohama; Noriko Kurihara, Tokyo; Masaaki Matsushima; Kiyoshi Yamamoto, both of Yokohama, all of Japan

[73] Assignee: Canon Kabushiki Kaisha, Tokyo, Japan

[21] Appl. No.: 226,106

[22] Filed: Apr. 11, 1994

Related U.S. Application Data

[63] Continuation of Ser. No. 854,760, Mar. 20, 1992, abandoned, which is a continuation of Ser. No. 443,152, Nov. 30, 1989, abandoned.

[30] Foreign Application Priority Data

Dec. 7, 1988 [JP] Japan .................. 63-307933
Dec. 7, 1988 [JP] Japan .................. 63-307934
Mar. 10, 1989 [JP] Japan .................. 1-56245

[51] Int. Cl.⁶ ..................................... C03B 40/00
[52] U.S. Cl. .................................. 65/286; 65/305; 65/374.11; 65/374.13; 65/374.15; 106/38.28; 106/38.9; 427/133; 427/135; 264/338
[58] Field of Search ............. 65/26, 286, 305, 374.11, 65/374.12, 374.13, 374.15; 106/38.28, 38.9; 427/133, 35; 264/338

[56] References Cited

U.S. PATENT DOCUMENTS

| | | | |
|---|---|---|---|
| 4,303,442 | 12/1981 | Hara et al. ....................... | 72/467 |
| 4,481,023 | 11/1984 | Marechal et al. .................. | 65/64 |
| 4,721,518 | 1/1988 | Monji et al. ...................... | 65/122 |
| 4,747,864 | 5/1988 | Hagerty et al. .................. | 65/374.11 |
| 4,882,827 | 11/1989 | Kusumi et al. ................... | 65/374.13 |
| 4,948,627 | 8/1990 | Hata .............................. | 427/574 |

FOREIGN PATENT DOCUMENTS

| | | |
|---|---|---|
| 49-51112 | 5/1974 | Japan . |
| 52-45613 | 4/1979 | Japan . |
| 60-246230 | 5/1985 | Japan . |
| 61-183134 | 8/1986 | Japan . |

*Primary Examiner*—W. Gary Jones
*Assistant Examiner*—John M. Hoffman
*Attorney, Agent, or Firm*—Fitzpatrick, Cella, Harper & Scinto

[57] ABSTRACT

A diamond sintered product having diamond particles sintered with a suitable sintering aid is the most suitable as the material for the mold for optical element molding, because it has in combination the advantage of diamond that no fusion with glass at high temperature occurs and oxidation occurs with difficulty to give rise to no precipitation of lead, an appropriate hardness and also the advantage that mirror polishing is possible. "There is also disclosed a mold which has a diamond layer having a (100) face, made by the CVD method utilizing gas having 1-3% methane in hydrogen."

2 Claims, 4 Drawing Sheets

MOLD HAVING A DIAMOND LAYER, FOR MOLDING OPTICAL ELEMENTS

This application is a continuation of application Ser. No. 07/854,760 filed Mar. 20, 1992, now abandoned, which is a continuation of application Ser. No. 07/443,152 filed Nov. 30, 1989, now abandoned.

BACKGROUND OF THE INVENTION

1. Field of the Invention

This invention relates to a mold to be used for preparing an optical element comprising a glass such as lens, prism, etc. by press molding of a glass preform, and also to a process for preparing the above mold and a process for preparing an optical element.

2. Related Background Art

The technique for preparing a lens by press molding of a glass preform without requiring polishing steps, which obviates the complicated steps required in preparation of a lens in the prior art and enables preparation of a lens simply and inexpensively, has been recently used for preparation of an optical element comprising a glass including not only a lens but also a prism, etc. and others.

The properties required for such mold material to be used for press molding of an optical element are excellent hardness, heat resistance, releasability, mirror workability, etc. In the prior art, there have been a great number of proposals for this kind of mold material such as metals, ceramics and materials coated with them. To mention some examples, 13Cr martensite steel is disclosed in Japanese Laid-open Patent Publication No. 49-51112, SiC and $Si_3N_4$ in Japanese Laid-open Patent Publication No. 52-45613, a material of super-alloy coated with noble metal in Japanese Laid-open Patent Publication No. 60-246230, and also a material coated with a diamond thin film or a diamond-like carbon film in Japanese Laid-open Patent Publication No. 61-183134.

U.S. Pat. No. 4,481,023 discloses tungsten carbide as the material for the mold for molding to be used in a process including the steps of:

(a) preparing a glass preform having a shape approximate to the shape of a desired final product;

(b) preparing a cast mold having an internal shape corresponding accurately to the shape of the desired final product;

(c) exposing said glass preform to a temperature at which its viscosity exists within the range of $10^8$ to $10^{12}$;

(d) exposing said cast mold to the same temperature as said glass preform or approximate thereto;

(e) arranging said preform in said cast mold while said Glass preform exists within said viscosity range, applying a load on said cast mold over sufficient period of time thereby to make the temperature of said cast mold at least in the vicinity of said mold substantially the same as said preform, and also molding said preform into a shape coincident with the internal shape of said cast mold;

(f) removing the Glass molded product from said cast mold while it exists at a temperature where its viscosity is smaller than $10^{13}$ poise; and (g) annealing the Glass molded product.

However, 13Cr martensite steel has the drawbacks that it is susceptible to oxidation, and further that Fe is diffused into Glass at high temperature to color Glass. On the other hand, SiC, $Si_3N_4$, which are Generally accepted to be oxidized with difficulty, also suffer from oxidation at high temperature to form a film of $SiO_2$ on the surface, whereby fusion occurs with Glass, and further have the drawback that workability of the mold itself is very poor on account of high hardness. The material coated with a noble metal will cause fusion with difficulty, but since it is very soft, it has the drawback that it is liable to be damaged and deformed. Also, the material coated with a diamond film lacks smoothness of the surface and therefore mirror surface characteristic of an optical element is lacking.

The film called diamond-like carbon film is not limited to one kind, but includes (1) an amorphous film, which consists only of carbon, but with the bonding form of a hybrid of sp, $sp^2$ and $sp^3$; (2) a collective mass of fine graphites; (3) an amorphous film containing hydrogen atoms other than carbon atoms (hereinafter abbreviated as a-C:H film); (4) a film containing structures of fine diamonds or fine graphites and amorphous. Also, for the respective films as mentioned above, the properties of the film will differ depending on the ratio of sp, $sp^2$ and $sp^3$; (2), the size of graphite; (3), the ratio of hydrogen to carbon; and (4) the ratio of crystal to amorphous. Particularly, a film containing much multiple bonds or a long conjugated system with nonlocalized multiple bonds or containing graphite fine crystals is liable to reduce lead oxide which is the component of glass, whereby precipitation of lead occurs, thus having the drawbacks that durability of the mold is lowered and also that plane precision of the optical element is lowered.

Accordingly, an object of the present invention is to provide a mold for an optical element molding suitable for molding of an optical element of glass, particularly a mold for optical element molding which is free from fusion with glass at high temperature, is capable of mirror polishing, has an appropriate hardness, is hardly oxidizable and free from precipitation of lead.

SUMMARY OF THE INVENTION

1) According to the present invention, there is provided a mold for optical element molding to be used for press molding of an optical element comprising a glass, wherein at least the portion of said mold contacting the glass is a diamond sintered product comprising diamond particles and a sintering aid.

Diamond is chemically inert and stable without reaction with an optical glass element containing a large amount of lead or alkali elements at high temperature at which the optical element is molded, and hence will not cause precipitation of lead by reduction of lead oxide or cause fusion with glass to occur. Also, since its hardness is very high, no scratch damage, will be formed on the mold surface, and also no plastic deformation by press molding will occur. Thus, diamond has excellent properties as the material for the mold for optical element molding. However, its practical application is very difficult on account of the problems as described above.

The present inventors propose a mold of a diamond sintered product comprising diamond particles and a sintering aid, which is most suitable as the material for the mold for optical element molding, having the combined advantages of diamond that is no fusion with glass occurs at high temperature lead is precipitated with difficulty, the appropriate hardness and also the advantage that mirror polishing is attainable.

In the following, the present invention is described in detail.

For preparation of diamond sintered product, various methods have been known. For example, it can be obtained by mixing diamond particles having an average particle size of several μm to some 10 μm with metallic powder of Co, Ni, Fe, etc. with its amount controlled to a range of 1 to 20 vol. %, and then sintering the mixture under high temperature and high pressure conditions of 5 to 8 GPa and 1500° to 2000° C. for about one hour. Alternatively, there is the method in which a sintered product of WC containing several wt. % of Co and diamond powder are sintered under high temperature and high pressure conditions to have Co migrated to the diamond powder layer, thereby forming direct bonds between diamond particles. Another method in which in which a sintering aid is previously formed into film by vacuum vapor deposition, sputtering, etc. onto diamond particles to form a sintering aid film, followed by sintering under high temperature and high pressure. According to this method, the sintering aid can be distributed homogeneously as very fine particles, and yet can reduce the amount to be added as compared with other methods. According to these methods, direct bonds are formed between the diamond particles. Also, there is the method in which sintering is effected under low pressure and high temperature conditions with ceramics such as SiC, as the main binder.

The above-mentioned diamond sintered product may be prepared according to either method, but the amount of the sintering aid may be preferably as small as possible.

Thus, although a diamond sintered product consisting only of diamond particles without use of a sintering aid is ideal, it is presently very difficult to obtain such product. Accordingly, a sintering aid is added, but if the amount added exceeds 10 vol. %, the influence of the physical properties of the aid is increased, whereby mechanical strength, typically strength, may be lowered, or depending on the aid, fusion with glass or precipitation of Pb by reduction of lead oxide may be undesirably caused to occur. If the amount of the aid added is less than 1 vol. %, substantially no useable sintered product can be obtained.

The material which can be used as the sintering aid may be any other material than the transition metals as described above which can form a diamond sintered product having sufficient mechanical strength when sintered under high temperature and high pressure or low pressure and high temperature conditions, these include elements of Ti, Zr, Hf, V, Nb, Ta, Cr, Mo, W, Ru, Os, Rh, Ir, Ni, Pd, Pt, Cu, Ag, Au, Si, Ge, Sn, Pb, oxides, carbides, nitrides, borides of these or mixtures, alloys of these. Further, there is no problem at all if elements, compounds, mixtures other than those mentioned above may be mixed in minute amounts not larger than some 10000 ppm.

Next, for forming the sintered product into a mold for optical element molding, said sintered product may be ground to a desired shape and then mirror polished.

However, the thickness of the diamond sintered product generally obtained is limited. Therefore, previously the base for formation of diamond sintered product such as WC is previously worked to a mold shape for optical element molding, and the the diamond sintered product is formed by sintering, followed by mirror polishing, to obtain a mold for optical element molding having a desired shape.

As the polishing method, the method for polishing diamond single crystal generally known in the art may be used to perform mirror polishing.

2) According to the present invention, there are provided a mold for optical element molding according to be used for press molding of an optical element comprising a glass, wherein at least the molding face of the mold matrix is coated with a diamond film with the (100) face oriented in parallel to said molding face. Further, a mold for optical element molding to be used for molding of an optical element comprising a glass, wherein on at least the molding face of the mold matrix is formed an intermediate layer comprising a single layer or two or more layers having a composition of at least one selected from metals of the group 4a, 5a and 6a of the periodic table; carbides, nitrides, carbonitrides, carbonate nitrides, borides, borocarbides, boronitrides of Si and Al; and carbides and nitrides of B (boron), and a diamond film with the (100) face oriented in parallel to said molding face is coated through said intermediate layer.

The present invention provides a mold for optical element molding excellent in durability, moldability as the mold for optical element molding which can be provided for practical application, by improving the flatness of the surface which has been the problem in the prior art concerning the diamond film having excellent properties as the material coated on the mold for optical element molding.

Whereas, the method of gas phase synthesis of diamond has been known from Japanese Laid-open Patent Publications Nos. 58-51100, 58-110494, Japanese Patent Publication No. 61-2632.

Also, the method for forming a film by forming fine damages on a substrate by use of diamond abrasive particles to enhance the nucleation density of diamond crystals has been known (Japanese Patent Publication No. 62-27039). The surface of the diamond film formed according to these methods has generally unevenness of about 1000 Å to several μm.

On the other hand, in synthesis of diamond crystals, it has been known that the crystal face direction can be controlled by the synthetic conditions (Kobashi, Sato, Yukino, Kamo, Sedaka: Collected Gists of 33th Applied Physics, p. 285, spring, 1986).

Therefore, the diamond film is formed by use of the methods as mentioned above for the mold materials for optical element molding. At this time, the crystal face direction is controlled so that the (100) face of the diamond crystal may be directed in parallel to the mold surface by controlling the synthetic conditions. It is well known in the art that the (100) face of diamond is the softest of the (100), (111) and (110) faces. The (100) face is flattened by polishing or etching so that the surface roughness may become 0.03 um or less in terms of Rmax. The (100) face is not required to be completely in parallel to the mold surface, but may be slightly slanted. Also, if in not too great quantity, (111), (110) may also be present.

First, as the matrix of the mold for press molding, a matrix obtained by working a material which can be easily worked precisely and has heat resistance and impact resistance, such as tungsten-carbide, thermet, zirconia, precisely to spherical or non-spherical shape is placed in an alcoholic solution having diamond abrasive particles dispersed therein and subjected to damaging treatment by use of a sonication washer. Next, a diamond thin film is formed by the microwave plasma CVD method, the hot filament CVD method, the plasma jet method, the ECR plasma CVD method, etc. The gases employed at this time may be carbon containing gases, including hydrocarbons such as methane, ethane, propane, ethylene, benzene, acetylene, etc.; halogenated carbons such as methylene chloride, carbon tetrachloride, chloroform, trichloroethane, etc.; alcohols such as methyl alcohol, ethyl alcohol, etc.; ketones such as $(CH_3)_2CO$, $(C_6H_5)_2CO$, etc.; gases such as CO, $CO_2$; and inert gases such as $N_2$, $H_2$, $O_2$, $H_2O$, Ar, etc. Particularly, although there are differences depending on the device parameters between the systems using $CH_4$ and $H_2$, in the device system used by us, a diamond film with the (100) face grown in parallel to the matrix surface can be formed by making the methane concentration 1 to 3%.

Next, this face is flattened by the method which has been known in the prior art as the polishing method of diamond in which diamond powder and a skiving machine which is one kind of lapping machine are used, the method in which flattening is effected by rubbing a cast iron plate heated to 600° C. to 850° C. with a diamond film under hydrogen atmosphere, or by dry etching such as ion beam etching (IBE), ion beam assist etching (IBAE), reactive ion etching (RIE), reactive ion beam etching (RIBE) etc. For example, in the case of performing etching with oxygen (ashing) is, the (100) face can be oxidized with difficulty as compared with other (111) and (110) faces, and therefore is higher in controllability of etching rate and superior in effecting flattening than other faces.

Next, in the case when polishing as described above is performed, particularly when flattening is effected by mechanical polishing, unless adhesion between the diamond film and the mold matrix is sufficient, there will ensue such problem as peel-off or defect of the film. Also, while the film thickness of diamond is preferably thicker for polishing of the diamond film, if the film thickness becomes thicker, internal stress of film becomes greater, whereby adhesion with the mold matrix which is the substrate tends to become inferior. Accordingly, for forming a diamond film which has sufficient film thickness and yet maintains sufficient adhesion with the mold matrix which is the substrate, it is preferable to provide an intermediate layer for improving adhesion between the substrate and the diamond layer. Here, the intermediate layer enhances comprehensively adhesion between the diamond film and the mold matrix by relaxing internal stress of the diamond film, relaxing the difference in thermal expansion coefficient, or through high bonding force (adhesive force) between the substrate, the intermediate layer and the diamond layer. As the material for the intermediate layer, selected from such standpoint, it may comprise a single layer or plural layers of two or more layers having a composition of at least one selected from metals of the group 4a, 5a and 6a of the periodic table; carbides, nitrides, carbonitrides, carbonate nitrides, borides, boronitrides and borocarbides of Si and Al; and carbides and nitrides of B (boron).

In the diamond layer, nitrogen, oxygen, hydrogen, fluorine may be also contained in minute amounts within the range of not more than 10000 ppm.

3) As the third task of the present invention, there is provided a process for preparing a mold for optical element molding to be used for molding of an optical element comprising a glass, which comprises bonding a diamond formed on a substrate to at least the molding face of the mold matrix, and then removing said substrate, thereby coating a diamond film onto at least the molding face of the mold matrix.

In the present invention, a diamond film is previously formed on a substrate having a shape fitting to the mold to be used for molding, and after bonding the film to the molding mold with an appropriate bonding agent, the above substrate is removed to effect transfer (reversal) so that the back surface (substrate side surface) of the diamond film may become the molding face, whereby a mold for optical element molding with the surface comprising smooth diamond film is prepared.

More specifically, a mold for optical element molding on which a diamond film is to be provided and a substrate fitting thereto are prepared. This substrate should preferably be a material suitable for formation of diamond film, and at the same time a material which can be polished and etched, and also can finish its surface roughness to a mirror surface of 0.05 μm or less in terms of Rmax by polishing. As such material, Si, W, Mo, Ta, SiC, WC, $Si_3N_4$, $SiO_2$, $Al_2O_3$, etc. may be included.

First, the substrate surface is mirror polished to a surface roughness, which is preferably 0.05 μm or less in terms of Rmax, more preferably 0.01 μm or less. Next, diamond abrasive particles with an average particle size of 10 to 20 μm are dispersed in an alcohol, the above substrate is placed in this solution and then the solution is subjected to sonication vibration, thereby effecting fine damaging treatment on the substrate surface.

During this operation, it is preferable to optimize the conditions for damaging treatment so that the surface roughness of the substrate surface may not exceed 0.05 82 m in terms of Rmax. Thereafter, a diamond thin film is formed to several μm to some 100 μm by the microwave plasma CVD method, the hot filament CVD method, the plasma jet method, the ECR plasma CVD method, etc. The gases employed at this time may be carbon containing gases, including hydrocarbons such as methane, ethane, propane, ethylene, benzene, acetylene, etc.; halogenated carbons such as methylene chloride, carbon tetrachloride, chloroform, trichloroethane, etc.; alcohols such as methyl alcohol, ethyl alcohol, etc.; ketones such as $(CH_3)_2$, $(C_6H_5)CO$, etc.; gases such as CO, $CO_2$, etc. and mixtures of these gases with gases such as $N_2$, $H_2$, $O_2$, $H_2O$, Ar, etc.

Next, the surface of the diamond film formed is bonded onto the mold surface of a material which can easily be precisely worked as the matrix of mold for press molding and has heat resistance and hot impact resistance, such as tungsten carbide, thermet, zirconia, etc.

The bonding agent in this case may be preferably one which is good in wettability with diamond and can assure sufficient mechanical strength and geometrical dimensional precision under the conditions (heating temperature, pressing pressure, etc.) of optical element molding. As such material, there may be included elements such as Ti, Zr, Hf, V, Nb, Ta, Cr, Mo, W, Fe, Ru, Os, Co, Rh, Ir, Ni, Pd, Pt, Cu, Ag, AU, Si, Ge, Sn, Pb, etc., or compounds, mixtures of one kind or two or more kinds of these, or alloys such as Ag—Cu, Ag—Sn, Ti—Ag, Ti—Cu, Ti—Co, Ti—Ni, Au—Nb, Au—Ta, etc.

Also, on the mold matrix to be bonded, a bonding agent layer for solid phase bonding is formed. The bonding agent may be preferably one which has good adhesion to the mold matrix and sufficient strength by bonding, and at the same time sufficient bonding strength under the conditions (heating temperature, pressing pressure, etc.) of optical element molding. Particularly, it is critical that it should have a thermal expansion coefficient approximate to the both. For example, when the mold matrix is made of tungsten carbide, Ti, Ta, Ni, etc. are suitable. In carrying out bonding, it is preferable to use the same kind of material for the film on the diamond film and the film on the mold matrix and bond the diamond film onto the mold matrix by solid phase mutually bonding between the same kind of materials.

The bonding agent in this case is formed by vacuum vapor deposition, sputtering, ion plating or plating. The film thickness of the bonding agent may be such that the unevenness of the surface of the diamond film can be flattened on the diamond film side, and adhesion is not lowered through internal stress of the film, namely generally within the range of 1 to 10 μm, preferably 2 to 4 μm. Also, the film thickness of the film on the mold matrix and the layer participating in solid phase bonding, namely the solid phase bonding layer may be equal to this. Next, for effecting solid phase bonding, pressing may be carried out in vacuum higher than $1 \times 10^{-4}$ Torr, at a bonding temperature of 700° to 900° C. and a pressure of 0.1 to 10 kg/cm$^2$. The press time in this case, which may differ on the plane precision of the bonding face, etc., may be about 30 minutes to 3 hours. The solid phase bonding is not necessarily effected mutually between the same kind of materials, but different kinds of materials may be employed. However, in the latter case, the film thickness range from 100 μm to 1 mm, and the bonding temperature, the pressig pressure, the pressing time, etc. are higher or longer than the case of the same kind of materials.

After the diamond film is bonded onto the mold matrix, the substrate used for formation of the diamond film is removed by polishing or etching. As a result, the diamond film can be formed as reversed on the mold matrix. Since the surface of the diamond film has the shape of the substrate surface transferred thereon, it is very smooth as different from the surface inherent in the diamond film, and its surface roughness can be made 0.05 μm or less in terms of Rmax. However, when the mold shape is slipped from the desired shape by bonding or when the surface roughness exceeds 0.05 μm in terms of Rmax, the shape and the surface roughness can be modified to desired ones by use of the polishing method of diamond single crystal generally known in the art.

BRIEF DESCRIPTION OF THE DRAWINGS

FIG. 9 shows the substrate for formation of diamond film and the mold matrix for bonding this.

FIG. 10 and FIG. 11 show sectional views of the mold for molding, FIG. 10 showing the state before press molding and FIG. 11 the state after press molding.

FIG. 12 is a schematic illustration of the film forming device used for formation of the diamond thin film in Example 2.

Figure 1:
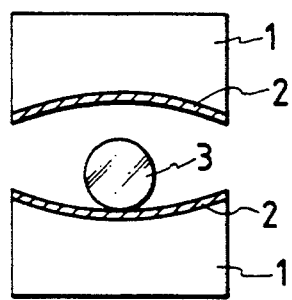
FIG. 1 and FIG. 2 are sectional views showing an embodiment of the mold for optical element molding according to the present invention, FIG. 1 showing the state before molding, and FIG. 2 the state after molding.

Referring now to the drawings, specific examples accomplishing the above first task are to be described.

EXAMPLE 1

Figure 2:
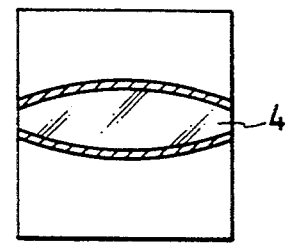

FIG. 1 and FIG. 2 show an embodiment of the mold for optical element molding according to the first task the present invention as mentioned above.

FIG. 1 shows the state before press molding of optical element and FIG. 2 the state after molding of optical element. In FIG. 1, 1 is a mold matrix, 2 is a diamond sintered product formed on the molding face of said mold matrix in contact with the glass preform, 3 is a glass preform and 4 in FIG. 2 is an optical element. As shown in FIG. 1, by press molding of the glass preform 3 placed between the molds, an optical element 4 such as lens, etc. is molded as shown in FIG. 2.

Here, as the mold matrix, sintered products of WC and SiC are used. Diamond particles with an average particle size of 1 to 2 μm formed into a film and added with 5 wt. % (about 1 vol. %) of W by sputtering are placed on these sintered products, assembled in a pressure medium and sintered at 5.5 GPa, 1500° C. for 30 minutes. When the diamond sintered product obtained is analyzed by X-ray diffracion, only peaks of diamond and WC are found without peak of W. Also, when hardness of the sintered product layer is measured, it is 7000 kg/mm$^2$ in terms of Vickers hardness. When this diamond sintered product layer is mirror polished, its surface roughness is Rmax 0.02 μm.

Next, examples of press molding of glass lenses by use of the mold for optical element molding according to the present invention are described. Table 1 shown below shows the kinds of mold materials provided for the experiments.

TABLE 1

| No. | Coating material | Matrix |
| --- | --- | --- |
| 1 | None | WC(90%) + Co(10%) |
| 2 | " | SiC |
| 3 | SiC | WC(90%) + Co(10%) |
| 4 | Diamond sintered product | WC |
| 5 | Diamond sintered product | SiC |

Nos. 1 to 3 are comparative materials, and Nos. 4 to 5 are materials proposed by the present invention. As the matrix, super-hard alloy, sintered WC and sintered SiC are employed. The molding device of lens used in the above examples is shown in FIG. 3.

Figure 3:
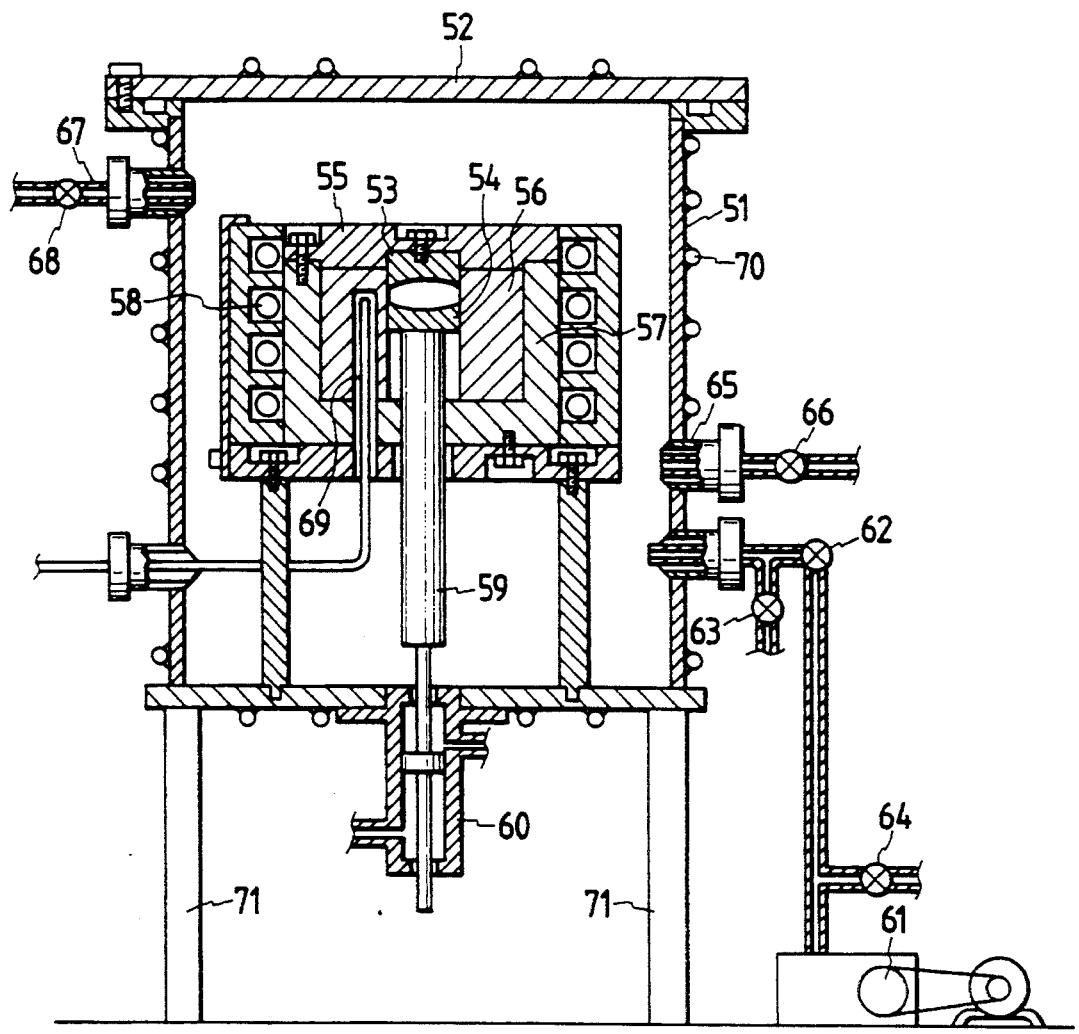
FIG. 3 and FIG. 5 are sectional views showing a molding device of lens by use of the mold for optical element molding according to the present invention, FIG. 3 showing the non-continuous molding type and FIG. 5 the continuous molding type.

In FIG. 3, 51 is main vacuum tank, 52 its lid, 53 upper mold for molding of optical element, 54 its lower mold, 55 press member for pressing the upper mold, 56 trunk mold, 57 mold holder, 58 heater, 59 thrust-up rod for thrusting up the lower mold, 60 air cylinder for actuating said thrust-up rod, 61 oil rotary pump, 62, 63 and 64 are valves, 65 is inert gas inflow pipe, 66 valve, 67 leak pipe, 68 valve, 69 temperature sensor, 70 water cooling pipe and 71 the stand for supporting the vacuum tank.

The steps for preparing lens are described below.

A glass preform obtained by controlling a flint optical glass (SF14) to a predetermined quantity and forming it into sphereical shape is placed within the cavity of a mold, which is in turn set in a device.

After the mold charged with the glass preform is set in a device, the lid 52 of the vacuum tank 51 is closed, water is permitted to flow through the water cooling pipe 70 and current passed through the heater 58. At this time, the valves 66 and 68 for nitrogen gas are closed, and the evacuation system valves 62, 63, 64 are also closed. The oil rotatory pump 61 is always rotated.

The valve 62 is opened to initiate evacuation, and the valve 62 is closed when the pressure becomes $10^{-2}$ or lower, and the valve 66 is opened to introduce nitrogen from the bomb into the vacuum tank. When a predetermined temperature is reached, the air cylinder 60 is actuated to effect pressurization under a pressure of 10 kg/cm$^2$ for 5 minutes. After removal of the pressure, cooling is effected to transition point or lower at a cooling rate of $-5°$ C./min., and thereafter cooling is performed at a rate of $-20°$ C./min. or more. When lowered to 200° C. or lower, the valve 66 is closed and the leak valve 63 is opened to introduce air into the vacuum tank 51. Then, the lid 52 is opened, the upper mold press member is dismantled and the molded product is removed.

Figure 4:
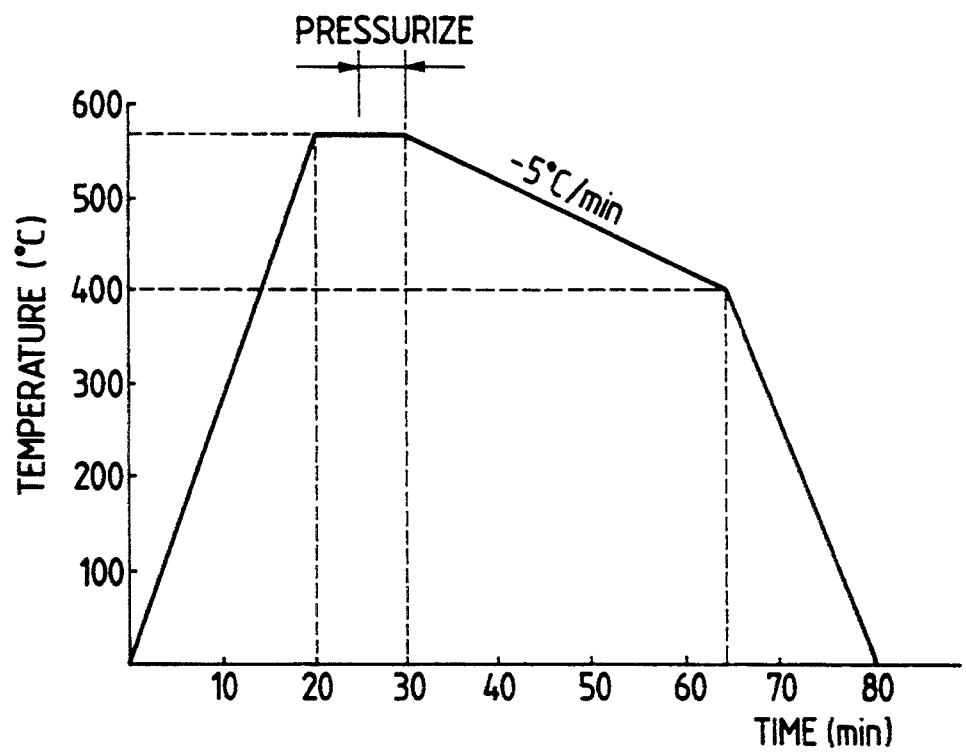
FIG. 4 is the time-temperature relationship diagram during lens molding.

As described above, the lens 4 shown in FIG. 2 is molded by use of a flint type optical glass SF14 (softening point=586° C., transition point Tg=485° C.). The molding condition at this time, namely the time-temperature correlation diagram is shown in FIG. 4.

Next, the surface roughness of the lens molded and the surface roughness of the mold before and after molding are measured. The results are shown in Table 2.

compared with the mold material of the prior art even after repeated uses.

Figure 5:
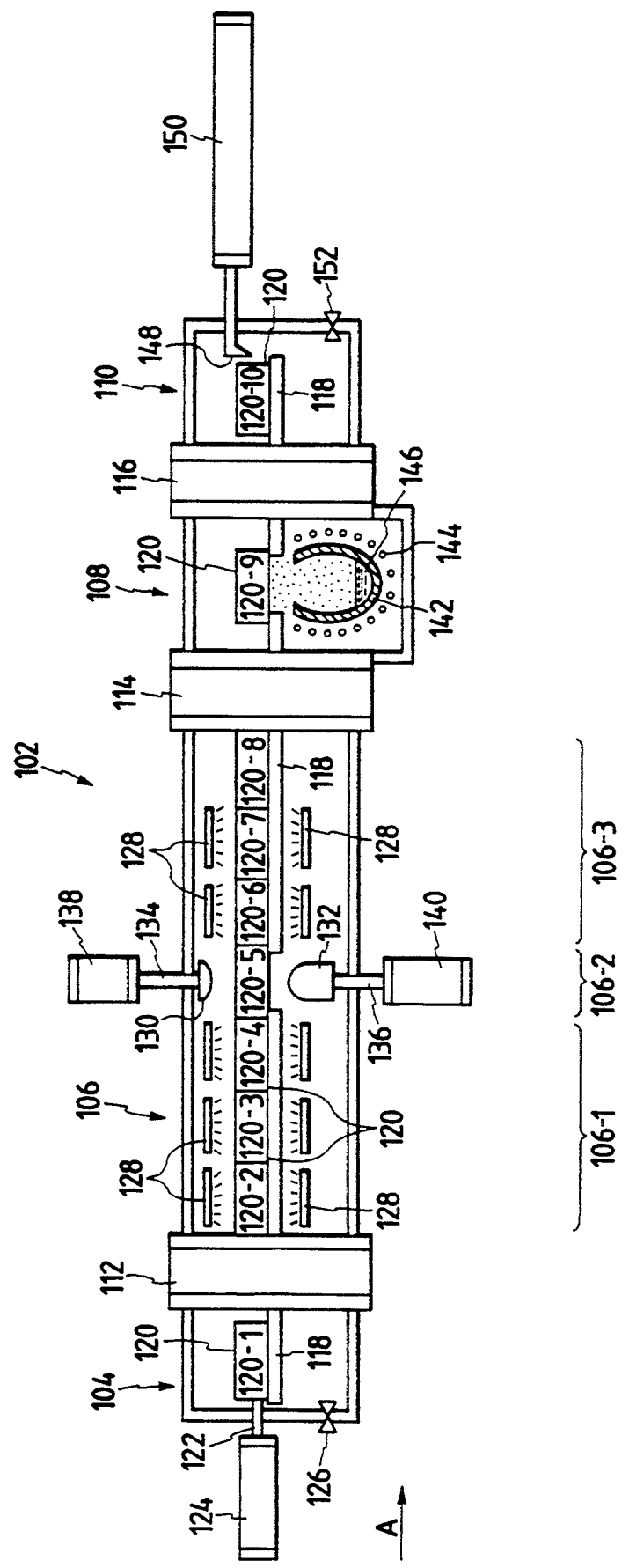

Next, by use of the above molds of No. 1 to 5, press molding of an optical glass is performed by means of the molding device shown in FIG. 5.

In FIG. 5, 104 is replacement chamber for take-in, in, 106 molding chamber, 108 vapor deposition chamber and 110 replacement chamber for take-out. 112, 114, 116 are gate valves, 118 is rail, 120 palette to be conveyed in the arrowhead A direction on said rail. 124, 138, 140, 150 are cylinders, and 126, 152 are valves. 128 are heaters arranged in the molding chamber 106 along the rail 118.

Within the molding chamber 106, heating zone 106-1, press zone 106-2 and gradual cooling zone 16-3 are successively formed along the palette conveying direction. In the press zone 106-2, upper mold member for molding 130 is fixed at the lower end of the rod 134 of the above cylinder 138. and lower mold member for molding 132 is fixed at the upper end of the rod 136 of the above cylinder 140. These upper mold member 130 and the lower mold member 132 are mold members according to the present invention shown above in FIG. 2. In the vapor deposition chamber 108, there are arranged vessel 142 having vapor deposition substance 146 housed therein and heater 144 for heating said vessel.

A flint type optical glass (SF14, mid point Sp=586° C., glass transition point Tg=485° C.) is roughly worked to predetermined shape and dimension to obtain a blank for molding.

The glass blank is mounted on the palette 120, placed at the position 120-1 in the take-in replacement chamber 104, and the palette at said position is conveyed by pushing in the A direction with the rod 122 of the cylinder 124 beyond the gate valve 112 to the position 120-2 in the molding chamber. Placing thereafter successively newly palettes at predetermined timing into the take-in replacement chamber 104, the pallet is conveyed suc-

TABLE 2

| | | | Surface roughness $R_{max}$ (μm) | | | |
|---|---|---|---|---|---|---|
| No. | Coating | Matrix | Lens | Mold (before molding) | Mold (after molding) | Releasability |
| 1 | None | WC(90%) + Co(10%) | 0.04 | 0.02 | 0.03 | Good |
| 2 | " | SiC | — | 0.04 | — | Fused |
| 3 | SiC | WC(90%) + Co(10%) | — | 0.02 | — | Fused |
| 4 | Diamond sintered product | WC | 0.03 | 0.02 | 0.02 | Good |
| 5 | Diamond sintered product | SiC | 0.04 | 0.03 | 0.03 | Good |

Next, fusion is effected, and after performing molding for 200 times for No. 1, 4, 5 with the same mold, the surface roughness is measured. The results are shown in Table 3.

TABLE 3

| | Surface roughness $R_{max}$ (μm) | |
|---|---|---|
| No. | Lens | Mold (after 200 times) |
| 1 | 0.14 | 0.15 |
| 4 | 0.03 | 0.02 |
| 5 | 0.04 | 0.03 |

As is apparent from the results in Table 2 and Table 3 as described above, the mold material according to the present invention is excellent in releasability from the glass, and deterioration of the surface is very little as cessively everytime in the molding chamber 106 to the positions of 120-2→ . . . →120-8. During these operations, the glass blank is gradually heated by the heater 128 in the heating zone 106-1 to a temperature of softening point or higher at the position 120-4, and then conveyed to the press zone 106-2, where it is pressed under a pressure of 10 kg/cm$^2$ with the upper mold member 130 and the lower mold member 132 by actuation of the cylinders 138, 140. Then, the pressurizing force is released, cooling is effected to glass transition point or lower, and thereafter the cylinders 138, 140 are actuated to release the upper mold member 130 and the lower mold member 132 from the glass molded product. During said pressing, the above palette is utilized as the trunk mold member for molding. Therefter, the glass molded product is gradually cooled in the gradual cooling zone 16-3. The molding chamber 106 is internally filled with an inert gas.

The palette reaching the position 120-8 in the molding chamber 106 is conveyed in the next conveyance beyond the gate valve 114 to the position 120-9 in the vapor deposition chamber 108. Ordinarily, vacuum vapor deposition is performed here, but said vapor deposition is not carried out in this example. Then, in the next conveyance, the palette is conveyed beyond the gate valve 116 to the position 120-10 in the take-out replacement chamber 110. Further, during the next conveyance, the glass molded product is taken out of the molding device 102 with the rod 148 by actuation of the cylinder 150.

The surface roughness of the molding faces of the mold members 130, 132 before and after press molding as described above, the surface roughness of the optical element molded and releasability between the optical element molded and the mold members 130, 132 are shown in Table 4.

TABLE 4

| No. | Coating | Matrix | Surface roughness $R_{max}$ (μm) | | | Releasability |
| | | | Lens | Mold (before molding) | Mold (after molding) | |
|---|---|---|---|---|---|---|
| 1 | None | WC(90%) + Co(10%) | 0.04 | 0.02 | 0.03 | Good |
| 2 | None | SiC | — | 0.04 | — | Fused |
| 3 | SiC | WC(90%) + Co(10%) | — | 0.02 | — | Fused |
| 4 | Diamond sintered product | WC | 0.03 | 0.03 | 0.03 | Good |
| 5 | Diamond sintered product | SiC | 0.04 | 0.04 | 0.04 | Good |

Next, for No. 1, 4, 5, in which no fusion occurs, press molding is performed continuously for 10,000 times by use of the same mold members. The surface roughness of the molding face of the molding members 130, 132 in this case and the surface roughness of the optical face of the optical element molded are shown in Table 5.

TABLE 5

| No. | Molding times | Surface roughness $R_{max}$ (μm) | |
| | | Lens | Mold |
|---|---|---|---|
| 1 | 200 | 0.14 | 0.15 |
| | 1000 | 0.20 | 0.21 |
| | 5000 | 0.23 | 0.24 |
| | 10000 | 0.26 | 0.27 |
| 4 | 200 | 0.03 | 0.02 |
| | 1000 | 0.03 | 0.02 |
| | 5000 | 0.03 | 0.02 |
| | 10000 | 0.04 | 0.03 |
| 5 | 200 | 0.04 | 0.03 |
| | 1000 | 0.04 | 0.03 |
| | 5000 | 0.04 | 0.03 |
| | 10000 | 0.04 | 0.04 |

As described above, in this Example of the present invention, good surface precision can be sufficiently maintained even when repeatedly for press molding, and optical elements with good surface precision can be molded without causing fusion to occur.

EXAMPLE 2

By use of diamond particles with an average particle size of 2 μm or less and Co fine powder of some 100 Å, a diamond sintered product is formed on a SiC sintered product as the base. At this time, the amount of Co added which becomes the sintering aid is made 5, 10, 15 vol. %, and this is sintered at 7.7 GPa, 2000° C. according to the same method as in Example 1 for one hour. The surface of the diamond sintered product is mirror polished, and then its surface roughness and hardness are measured. The results are shown in Table 6.

TABLE 6

| No. | Amount of Co added (vol. %) | Surface roughness $R_{max}$ (μm) | Hardness, Vickers (kg/mm²) |
|---|---|---|---|
| 6 | 5 | 0.03 | 7000 |
| 7 | 10 | 0.03 | 6000 |
| 8 | 15 | 0.04 | 5000 |

Next, by use of these molds, a flint type optical glass (SF14) is pressed similarly as in Example 1 by means of the molding device shown in FIG. 3 used in Example 1.

The surface roughness of the lens molded and the surface roughness of the mold before and after molding are measured. The results are shown in Table 7.

TABLE 7

| No. | Amount of Co added (vol %) | Surface roughness $R_{max}$ (μm) | | | Amount of Pb precipitated |
| | | Lens | Mold (before molding) | Mold (after molding) | |
|---|---|---|---|---|---|
| 6 | 5 | 0.04 | 0.03 | 0.03 | None |
| 7 | 10 | 0.05 | 0.03 | 0.04 | Little |
| 8 | 15 | 0.06 | 0.04 | 0.06 | Much |

As the result, if the amount of Co added exceeds 10 vol. %, PbO is reduced to precipitate Pb, whereby even in the mold after molding and the lens, its surface roughness is too high to give a mirror surface.

Next, for Nos. 6 and 7, molding is performed for 200 times by use of the same mold, and then the surface roughness is measured. The results are shown in Table 8.

TABLE 8

| No. | Surface roughness $R_{max}$ (μm) | |
| | Lens | Mold (around 200 times) |
|---|---|---|
| 6 | 0.04 | 0.03 |
| 7 | 0.05 | 0.04 |

EXAMPLE 3

Ni film is formed by sputtering on diamond particles with an average particle size of 2 μm. Ni content is quantitated by atomic absorption spectrometry to be 1 vol. %. By use of the diamond particles having Ni film formed thereon and SiC sintered product, sintering is carried out at 7.7 GPa, 2000° C. for one hour to form a diamond sintered product. Next, the sintered product is mirror polished, and thereafter its surface roughness and hardness are measured. The surface roughness is 0.03 μm in terms of Rmax and the hardness 7000 kg/mm² in terms of Vickers hardness. When molding of an optical glass is performed by use of this mold similarly as in Example 2, the results shown in Table 9.

TABLE 9

| No. | Lens | Mold (before molding) | Mold (after molding) | Releasability |
|---|---|---|---|---|
| 8 | 0.04 | 0.03 | 0.03 | Good |

During this molding, no precipitation of Pb is observed.

Further, after molding is performed by use of this mold for 200 times, its surface roughness is measured. The results are shown in Table 10.

TABLE 10

| No. | Lens | Mold (around 200 times) |
|---|---|---|
| 8 | 0.04 | 0.03 |

EXAMPLE 4

By use of a WC-10% Co super-hard alloy having Ta formed by sputtering to 50 μm thereon as the mold base, diamond particles with an average particle size of 5 μm are placed thereon, assembled in a pressure medium and sintered at 6.5 GPa, 1500° C. for 50 minutes. After the sintered diamond is mirror polished, its surface roughness, hardness and composition are measured. The surface roughness is 0.04 μm in terms of Rmax, the hardness 6500 kg/mm² in terms of Vickers hardness, and only peaks of diamond and TaC are observed according to analysis by X-ray diffraction of the surface. Next, by use of this mold a flint type optical glass (SF14) is molded by the molding device shown in FIG. 3 similarly as in Example 1. The surface roughness of the lens molded and the surface roughness before and after molding are measured. The results are shown in Table 11.

TABLE 11

| No. | Lens | Mold (before molding) | Mold (after molding) | Releasability |
|---|---|---|---|---|
| 9 | 0.04 | 0.04 | 0.04 | Good |

No precipitation of Pb is observed in this molding.

Further, after molding is performed by use of this mold for 200 times, its surface roughness is measured. The results are shown in Table 12.

TABLE 12

| No. | Lens | Mold (around 200 times) |
|---|---|---|
| 9 | 0.04 | 0.04 |

The diamond sintered product obtained by sintering diamond particles with an appropriate sintering aid is free from fusion with a glass at high temperature, and mirror polishing is possible while having an appropriate hardness without precipitation of lead, alkali elements contained in the glass. According to the present invention, by forming the molding face of the mold of a diamond sintered product, a mold for optical element molding excellent in moldability and durability can be obtained.

Figure 6:
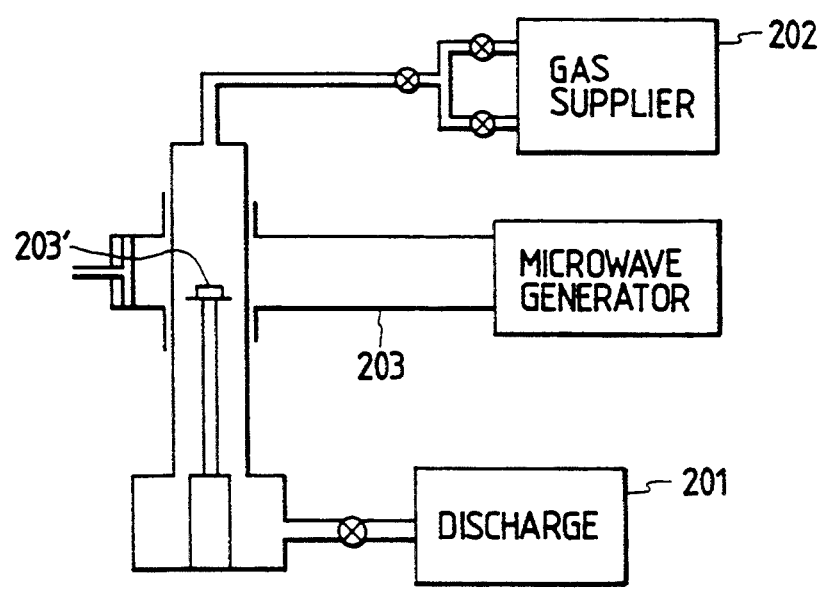
FIG. 6 is an illustration of a device for formation of the diamond film according to the second task of the present invention.
Figure 7:
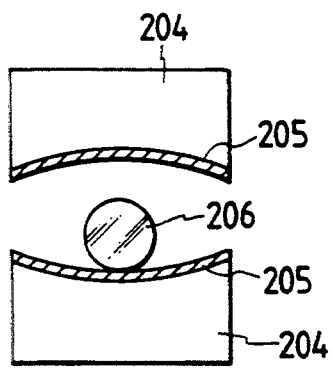
FIG. 7 and FIG. 8 are sectional views showing an embodiment of the mold for optical element molding according to the present invention, FIG. 7 showing the state before molding, and FIG. 8 the state after molding.
Figure 8:
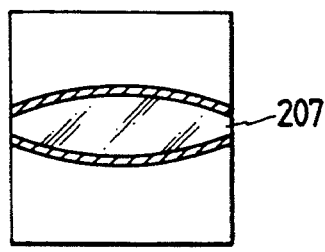

Referring now to FIG. 6 to FIG. 8, specific examples of the invention accomplishing the second task of the present invention are to be described.

EXAMPLE 5

By means of the microwave plasma CVD device shown in FIG. 6, a diamond thin film is precipitated to 5 μm on a mold matrix comprising WC-10% Co. At this time, the surface of the mold matrix is subjected to the damaging treatment after the mirror surface working of the molding face shape in a sonication washer in a solution of diamond abrasive particles with a particle size of 15 μm dispersed in ethyl alcohol for one hour in order to enhance diamond nucleation density. Depending on the extent of mirror surface working, no damaging treatment as mentioned above may be performed. Formation of the diamond thin film is performed by means of the microwave plasma CVD device shown in FIG. 6 by first evacuating to $1\times10^{-7}$ Torr by the evacuation system 201, and then delivering the gases from the gas feeding system 202 at the flow rates of $CH_4=2$ SCCM, $H_2=98$ SCCM to the reaction chamber to make the pressure in the reaction chamber 35 Torr. Next, by use of the microwave 203 of 2.45 GHz, a diamond polycrystalline film with a thickness of 5 μm is formed on the mold matrix with the power of the microwave being 400 W. At this time, the temperature of the mold matrix is made 850° C. The surface roughness of the diamond thin film obtained is measured by a contact needle type surface roughness meter to be 0.3 μm of Rmax. It is also confirmed by X-ray diffraction that the (100) face is oriented substantially in parallel to the substrate surface.

Next, the surface of the diamond thin plate is polished by rubbing with a cast iron dish having a desired spherical shape. At this time, the circumferential speed of the polishing surface is 20 cm/min. on an average with a polshing load of 600 g/m², the atmosphere being hydrogen gas at about 300 Torr and the temperature of the cast iron dish being made 800° C. The polishing device is located within the vacuum device, and evacuation is effected to $1\times10^{-5}$ Torr before polishing, and then hydrogen is fed to the pressure as mentioned above. By such polishing, the surface roughness of the film surface is 0.03 μm in terms of Rmax and the film thickness 4 μm. The polishing speed at this time is 1 μm/h.

Comparative Example

By use of the mold matrix as described above, by means of the microwave plasma CVD device shown in FIG. 6, evacuation is effected similarly, and then through the gas feeding system 202, $CH_4$ is flowed at 0.5 SCCM and $H_2$ at 99.5 SCCM, to make the pressure in the reaction chamber 35 Torr, and a diamond thin film a thickness of about 5 μm is formed on the mold matrix by microwave discharging under the same conditions. At this time, the temperature of the mold matrix is 850° C. The surface roughness of the film obtained is 1 μm in terms of Rmax. By X-ray diffraction, (111), (110) peaks are obtained, and particularly it is found to be a film composed mainly of the (111) face. Next, when the film surface is polished similarly as described above, the surface roughness of the film surface after polishing is 0.05 μm in terms of Rmax and the film thickness 3 μm. The polishing speed at this time is 0.4 μm/h.

Thus, when the diamond thin film has the (100) face oriented in parallel to the mold matrix surface, as compared with the case when not so oriented, not only the polishing speed can be made by far faster, but also the surface roughness after polishing can be improved.

FIG. 7 and FIG. 8 show an embodiment of the mold for optical element molding according to the present invention.

FIG. 7 shows the state before press molding of the optical element, and FIG. 8 the state after molding of the optical element. In FIG. 7, 204 is mold matrix, 205 diamond layer formed on the molding face of said matrix mold where glass preform is in contact, 206 is glass preform and 207 in FIG. 8 is optical element. By press molding of the glass preform 206 placed between the molds as shown in FIG. 7, the optical element 207 such as lens, etc. is formed as shown in FIG. 7.

Next, an example of press molding a glass lens with the mold for optical element molding according to the present invention is described in detail. Table 13 shown below shows the kinds of the mold materials provided for the experiments.

TABLE 13

| No. | Coating material | Matrix |
| --- | --- | --- |
| 10 | None | WC(90%) + Co(10%) |
| 11 | None | SiC |
| 12 | SiC | WC(90%) + Co(10%) |
| 13 | Diamond | WC(90%) + Co(10%) |

No. 10 to 12 are comparative materials, and No. 13 is the material proposed by the present invention. As the matrix, super-hard alloy WX (90%)+Co (10%) is used. As the molding device used in the above Example, the same device as shown in FIG. 3 is used.

The steps for preparing lens are described below.

A glass preform obtained by controlling a flint optical glass (SF14) to a predetermined quantity and forming it into sphereical shape is placed within the cavity of a mold, which is in turn set in a device.

After the mold charged with the glass preform is set in a device, the lid 52 of the vacuum tank 51 is closed, water is permitted to flow through the water cooling pipe 70 end current passed through the heater 58. At this time, the valves 66 and 68 for nitrogen gas are closed, and the evacuation system valves 62, 63, 64 are also closed. The oil rotatory pump 61 is always rotated.

The valve 62 is opened to initiate evacuation, and the valve 62 is closed when the pressure becomes $10^{-2}$ Torr or lower, and the valve 66 is opened to introduce nitrogen from the bomb into the vacuum tank. When a predetermined temperature is reached, the air cylinder 60 is actuated to effect pressurization under a pressure of 10 kg/cm$^2$ for 5 minutes. After removal of the pressure, cooling is effected to transition point or lower at a cooling rate of $-5°$ C./min., and thereafter cooling is performed at a rate of $-20°$ C./min. or more. When lowered to 200° C. or lower, the valve 66 is closed and the leak valve 63 is opened to introduce air into the vacuum tank 51. Then, the lid 52 is opened, the upper mold press member is dismantled and the molded product is removed.

As described above, the lens 4 shown in FIG. 3 is molded by use of a flint type optical glass SF14 (softening point=586° C., transition point Tg=485° C.). The molding condition at this time, namely the time-temperature correlation diagram is the same as shown in FIG. 4.

Next, the surface roughness of the lens molded and the surface roughness of the mold before and after molding are measured. The results are shown in Table 14.

TABLE 14

| | | | Surface roughness $R_{max}$ (μm) | | | |
| --- | --- | --- | --- | --- | --- | --- |
| No. | Coating | Matrix | Lens | Mold (before molding) | Mold (after molding) | Releasability |
| 10 | None | WC(90%) + Co(10%) | 0.04 | 0.02 | 0.03 | Good |
| 11 | None | SiC | — | 0.04 | — | Fused |
| 12 | SiC | WC(90%) + Co(10%) | — | 0.02 | — | Fused |
| 13 | Diamond | WC(90%) + Co(10%) | 0.03 | 0.03 | 0.03 | Good |

Next, fusion is effected, and after performing molding for 200 times for No. 10, 13 with the same mold, the surface roughness is measured. The results are shown in Table 15.

TABLE 15

| | Surface roughness $R_{max}$ (μm) | |
| --- | --- | --- |
| No. | Lens | Mold (after 200 times) |
| 10 | 0.14 | 0.15 |
| 13 | 0.03 | 0.03 |

As is apparent from the results in Table 14 and Table 15 as described above, the mold material according to the present invention is excellent in releasability from the glass, and deterioration of the surface is very small as compared with the mold material of the prior art even after repeated uses.

EXAMPLE 6

By use of WC (90%)+Co (10%) as the mold matrix, the mold surface is mirror worked to the molding face shape, followed by sputtering of SiC to about 1 μm. Then, a diamond film is formed to 20 μm according to the same method and the conditions as in Example 5. The film surface roughness is 0.5 μm of Rmax, and it is confirmed by X-ray diffraction that the (100) face is oriented in parallel to the substrate surface.

Next, the film surface is polished according to the same method as in Example 5 to obtain a mirror surface with a surface roughness of 0.03 μm of Rmax. Even when TiC, TaC, HfC, ZnC is used as the intermediate layer, the (100) face is similarly oriented, whereby a mirror surface of 0.03 μm of Rmax can be obtained.

Next, a flint type optical glass (SF 14) is molded similarly as in Example 5. As a result, the surface roughnesses of the lens molded, of the mold before molding and of the mold after molding are 0.03 μm, 0.03 μm and 0.03 μm of Rmax, respectively. Also, releasability is found to be good.

Further, press molding of the optical glass is performed by use of the mold members shown in Table 16.

TABLE 16

| No. | Coating material | Matrix |
| --- | --- | --- |
| 10 | None | WC(90%) + Co(10%) |
| 11 | None | SiC |
| 12 | SiC | WC(90%) + Co(10%) |
| 13 | Diamond, intermediate layer | WC(90%) + Co(10%) |

TABLE 16-continued

| No. | Coating material | Matrix |
|---|---|---|
| | SiC | |

For the present invention, by use of the molding device, an optical element is prepared.

The surface roughness of the molding face of the mold members 130, 132, the surface roughness of the optical face of the optical element formed, and the releasability between the molded optical element and the mold members, 130, 132 are shown in Table 17.

TABLE 17

| | | | Surface roughness $R_{max}$ (μm) | | |
|---|---|---|---|---|---|
| No. | Coating | Matrix | Lens | Mold (before molding) | Mold (after molding) | Releasability |
| 10 | None | WC(90%) + Co(10%) | 0.04 | 0.02 | 0.03 | Good |
| 11 | None | SiC | — | 0.04 | — | Fused |
| 12 | SiC | WC(90%) + Co(10%) | — | 0.02 | — | Fused |
| 13 | Diamond, intermediate layer SiC | WC(90%) + Co(10%) | 0.03 | 0.03 | 0.03 | Good |

Next, for No. 10, 13 which causes no fusion to occur, press molding is performed continuously for 10,000 times by use of the same mold members. The surface roughness of the mold members 130, 132 and the surface roughness of the optical face of the optical element molded in this case are shown in Table 18.

TABLE 18

| | | Surface roughness $R_{max}$ (μm) | |
|---|---|---|---|
| No. | Molding times | Lens | Mold |
| 10 | 200 | 0.14 | 0.15 |
| | 1000 | 0.20 | 0.21 |
| | 5000 | 0.23 | 0.24 |
| | 10000 | 0.26 | 0.27 |
| 13 | 200 | 0.03 | 0.03 |
| | 1000 | 0.03 | 0.03 |
| | 5000 | 0.03 | 0.03 |
| | 10000 | 0.04 | 0.03 |

As described above, in the Examples of the present invention, good surface precision can be sufficiently maintained even when used repeatedly for press molding, and optical element with good surface precision can be molded without occurrence of fusion.

Paricularly, by use of SiC having a thermal expansion coefficient ($\alpha = 4.7 \times 10^{-6}$) which is a middle value between the thermal coefficients of the mold matrix (WC: $\alpha = 5.5 \times 10^{-6}$) and diamond film ($\alpha = 4.5 \times 10^{-6}$) as the intermediate layer, the mold is confirmed to have high durability even under the molding condidtions as described above. Also, the problems of partial peeling or defect during polishing of diamond layer or continuous molding of optical element occurring when the diamond layer is made thick as 20 μm without formation of the intermediate layer are also solved.

According to the mold for optical element molding of the present invention, releasability from glass is excellent, mirror polishing is possible and deterioration of the surface is very little as compared with the mold of the prior art even when used repeatedly.

According to the present invention, by orienting the (100) face of diamond in parallel to the molding face of the mold, the diamond film formed on the mold surface can be easily mirror polished, whereby practical application of a mold coated with diamond film, which has been difficult in the prior art, can be realized. Particularly, by use of a diamond film, a mold for optical element molding excellent in durability can be obtained without fusion on glass at high temperature or the reaction with lead, alkali elements contained in glass.

In the following, examples of the invention accomplishing the third task of the present invention are to be described.

EXAMPLE 7

Figure 9:
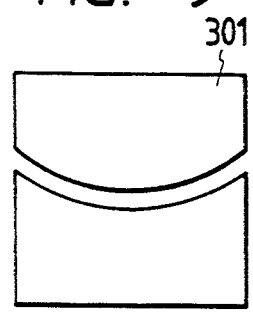
FIG. 9 to FIG. 12 concern the invention of the third task of the present invention.

The mold for optical element molding shown in FIG. 9 comprises WC (90%)+Co (10%), and the molding face is mirror finished to 0.01 μm or less in terms of Rmax. The surface of the substrate 1 comprising Si fitted to the mold is polished similarly to Rmax<0.01 μm. Next, said substrate 1 is placed in a solution of diamond abrasive particles with an average particle size of 10 to 15 μm dispersed in ethyl alcohol, and damaging treatment is applied on its surface by sonication vibration for 1.5 hours. The surface roughness of this substrate is measured to be Rmax=0.10 μm. Next, by means of the microwave plasma CVD device shown in FIG. 6, first evacuation is effected to $1 \times 10^{-7}$ Torr by the evacuation system 2, and then the gasses are delivered through the gas feeding system 3 into the reaction chamber at $CH_4$=0.8 SCCM and $H_2$=99.2 SCCM to make the pressure in the reaction chamber 40 Torr. Next, by use of the microwave 4 of 2.45 GHz with the power of microwave being made 450 W, a diamond polycrystalline film with a thickness of about 10 μm is formed on the Si substrate. At this time, the substrtate temperature is made 850° C. Ths surface roughness of the diamond thin film obtained is measured by a contact needle type surface roughness meter to be 0.6 μm of Rmax. Here, with the diamond thin film of 1 μm thickness formed under the same conditions, it is a polycrystalline film with an average particle size of 0.3 μm to 0.4 μm and a nucleation density of 6 to 9 μm$^{-2}$. Next, after Ti is formed to about 3 μm by sputtering on the diamond thin film, Ag is formed to about 3 μm according to vacuum vapor deposition. Similarly, after Ni is formed to about 3 μm on the mold surface by ion plating, Ag is formed to about 3 μm by vacuum vapor deposition. After the substrate and the mold matrix are fitted together, heating is effected in vacuum at 850° C. to bond the substrate and the mold matrix. Here, bonding between the substrate and the mold matrix is effected by fixing under a uniform force of about 0.15 kg/mm$^2$ for about 3 hours.

Then, the Si substrate is polished, until finally Si is completely removed with an etchant such as potassium hydroxide or $HNO_3$:HF:$CH_3COOH$=5:3:3, etc. The surface of the diamond film obtained is measured by the contact needle type surface roughness meter as mentioned above to be Rmax=0.02 μm.

Figure 10:
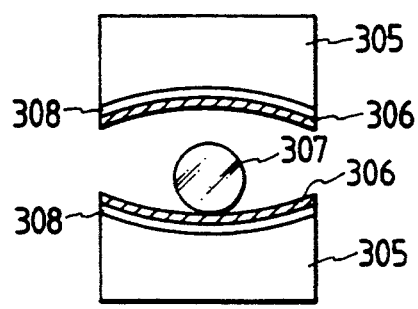
Figure 11:
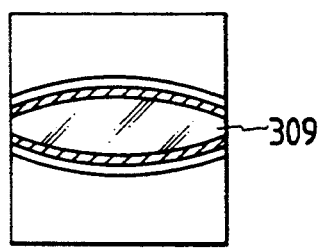

FIG. 10 and FIG. 11 show an embodiment of the mold for optical element molding according to the present invention. FIG. 10 shows the state before press molding of the optical element, and FIG. 11 the state after optical element molding. In FIG. 10, 305 is mold matrix, 306 diamond layer formed on the molding face of said mold matrix where glass preform is in contact, 307 is glass preform, 308 is bonded layer having the diamond layer 306 bonded to the mold matrix, and 309 in FIG. 11 is optical element. As shown in FIG. 10, by press molding of the glass preform placed between the molds 307, an optical element 309 such as lens, etc. is formed as shown in FIG. 10.

Next, an example of press molding a glass lens with the mold for optical element according to the present invention is described in detail. Table 19 shown below shows the kinds of mold materials provided for the experiments.

TABLE 19

| No. | Coating material | Matrix |
|---|---|---|
| 14 | None | WC(90%) + Co(10%) |
| 15 | None | SiC |
| 16 | SiC | WC(90%) + Co(10%) |
| 17 | Bonding agent + Diamond | WC(90%) + Co(10%) |

No. 14 to 16 are comparative examples, and No. 17 is the material proposed by the present invention. As the matrix, super-hard alloy WC (90%)+Co (10%) is used. The molding device of lens used in the above Example is the same as the device shown in FIG. 3.

The steps for preparing lens are described below.

A glass preform obtained by controlling a flint optical glass (SF14) to a predetermined quantity and forming it into sphereical shape is placed within the cavity of a mold, which is in turn set in a device.

After the mold charged with the glass preform is set in a device, the lid 52 of the vacuum tank 51 is closed, water is permitted to flow through the water cooling pipe 70 and current passed through the heater 58. At this time, the valves 66 and 68 for nitrogen gas are closed, and the evacuation system valves 62, 63, 64 are also closed. The oil rotatory pump 61 is always rotated.

The valve 62 is opened to initiate evacuation, and the valve 62 is closed when the pressure becomes $10^{-2}$ or lower, and the valve 66 is opened to introduce nitrogen from the bomb into the vacuum tank. When a predetermined temperature is reached, the air cylinder 60 is actuated to effect pressurization under a pressure of 10 kg/cm². After removal of the pressure, cooling is effected to transition point or lower at a cooling rate of $-5°$ C./min., and thereafter cooling is performed at a rate of $-20°$ C./min. or more. When lowered to 200° C. or lower, the valve 66 is closed and the leak valve 63 is opened to introduce air into the vacuum tank 51. Then, the lid 52 is opened, the upper mold press member is dismantled and the molded product is removed.

As described above, the lens 4 shown in FIG. 4 is molded by use of a flint type optical glass SF14 (softening point=586° C., transition point Tg=485° C.). The molding condition at this time, namely the time-temperature correlation diagram is the same as shown in FIG. 4.

Next, the surface roughness of the lens molded and the surface roughness of the mold before and after molding are measured. The results are shown in Table 20.

TABLE 20

| | | | Surface roughness $R_{max}$ (μm) | | | |
|---|---|---|---|---|---|---|
| No. | Coating | Matrix | Lens | Mold (before molding) | Mold (after molding) | Releasability |
| 14 | None | WC(90%) + Co(10%) | 0.04 | 0.02 | 0.03 | Good |
| 15 | None | SiC | — | 0.04 | — | Fused |
| 16 | SiC | WC(90%) + Co(10%) | — | 0.02 | — | Fused |
| 17 | Bonding agent + Diamond | WC(90%) + Co(10%) | 0.03 | 0.02 | 0.02 | Good |

Next, fusion is effected, and after performing molding for 200 times for No. 14, 17 with the same mold, the surface roughness is measured. The results are shown in Table 21.

TABLE 21

| | Surface roughness $R_{max}$ (μm) | |
|---|---|---|
| No. | Lens | Mold (after 200 times) |
| 14 | 0.14 | 0.15 |
| 17 | 0.03 | 0.02 |

As is apparent from the results in Table 20 and Table 21 as described above, the mold material according to the present invention is excellent in releasability from the glass, and deterioration of the surface is very little as compared with the mold material of the prior art even after repeated use.

EXAMPLE 8

Figure 12:
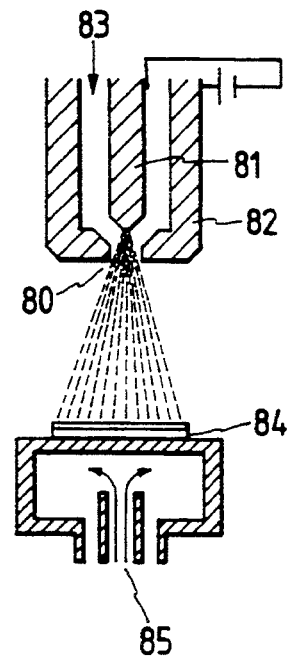

By use of WC (90%)+(Co (10%) as the mold matrix, the mold surface is mirror worked to the molding face shape, and then a substrate comprising Si fitting to the mold matrix is mirror worked. FIG. 12 shows a film forming device. In the same Figure, 80 is nozzle, 81 cathode, 82 anode, 83 gas feeding system, 84 substrate and 85 cooling water. By means of DC plasma jet CVD device, a diamond thin film is formed to about 100 μm on the Si substrate. At this time, the conditions are made $CH_4$:5 SCCM, $H_2$:95 SCCM, pressure: 20 Torr, substrate temperature: 800° C. and current density: 0.8 A/cm².

Subsequenty, Ti is formed by sputtering to 3 μm on the diamond thin film similarly as in Example 7, and further Ni to about 3 μm by vacuum vapor deposition. Next, Ni is formed similarly to 3 μm on the mold surface. After the substrate and the mold matrix are fitted together, heating is effected to 850° C. in vacuum to bond the Si substrate and the mold matrix similarly as in Example 7. Then, Si is removed similarly as in Example 7. The surface of the diamond film obtained is measured by a contact needle type surface roughness meter to be Rmax=0.03 μm .

Next, a flint type optical glass (SF14) is molded similarly as in Example 7. As the result, the surface roughnesses of the lens molded, of the mold before molding and of the mold after molding are 0.03 μm, 0.03 μm and 0.03 μm of Rmax, respectively, releasability between the optical element and the mold is also found to be good.

Further, by use of the mold members shown in Table 22, press molding of optical glass is performed.

TABLE 22

| No. | Coating material | Matrix |
|-----|------------------|--------|
| 14 | None | WC(90%) + Co(10%) |
| 15 | None | SiC |
| 16 | SiC | WC(90%) + Co(10%) |
| 17 | Bonding agent + Diamond | WC(90%) + Co(10%) |

By use of the mold according to the present invention, molding is performed by means of the molding device shown in FIG. 5.

The surface roughness of the molding face of the mold members 130, 132, the surface roughness of the optical face of the optical element formed, and the releasability between the molded optical element and the mold members, 130, 132 are shown in Table 23.

TABLE 23

| | | | Surface roughness $R_{max}$ (μm) | | |
|-----|---------|-------------------|------|----------------------|---------------------|---------------|
| No. | Coating | Matrix | Lens | Mold (before molding) | Mold (after molding) | Releasability |
| 14 | None | WC(90%) + Co(10%) | 0.04 | 0.02 | 0.03 | Good |
| 15 | None | SiC | — | 0.04 | — | Fused |
| 16 | SiC | WC(90%) + Co(10%) | — | 0.02 | — | Fused |
| 17 | Bonding agent + Diamond | WC(90%) + Co(10%) | 0.03 | 0.03 | 0.03 | Good |

Next, for No. 14, 17 which causes no fusion to occur, press molding is performed continuously for 10,000 times by use of the same mold members. The surface roughness of the mold members 130, 132 and the surface roughness of the optical face of the optical element molded in this case are shown in Table 24.

TABLE 24

| | | Surface roughness $R_{max}$ (μm) | |
|-----|---------------|------|------|
| No. | Molding times | Lens | Mold |
| 14 | 200 | 0.14 | 0.15 |
| | 1000 | 0.20 | 0.21 |
| | 5000 | 0.23 | 0.24 |
| | 10000 | 0.26 | 0.27 |
| 17 | 200 | 0.03 | 0.03 |
| | 1000 | 0.03 | 0.03 |
| | 5000 | 0.03 | 0.03 |
| | 10000 | 0.04 | 0.03 |

As described above, in the Examples of the present invention, good surface precision can be sufficiently maintained even when used repeatedly for press molding, and optical element with good surface precision can be molded without occurrence of fusion.

According to the present invention, by forming previously a diamond (thin) film on a substrate having a shape fitted to the mold to be used for molding, and after bonding the film and the molding mold with an appropriate bonding agent, removing the above substrate to form the diamond film as reversed on the molding mold, a mold with the surface comprising a smooth diamond film can be realized without application of mirror working such as polishing, etc. Particularly, by use of a diamond film, a mold for optical element molding excellent in durability can be obtained, which is free from fusion with glass at high temperature and without the reaction with lead, alkali elements contained in glass.

We claim:

1. A mold for press molding of an optical glass element, comprising:
   a mold matrix; and
   a diamond sintered product provided on the mold matrix comprising diamond particles and a sintering aid, said sintering aid being at least one metal selected from the group consisting of Ti, Ta, W and Mo, wherein the content of said sintering aid is from 1–10% by volume of said diamond sintered product;
   wherein a a molding face is formed by said diamond sintered product.

2. A mold for press molding of an optical glass element comprising:
   a mold matrix;
   an intermediate layer formed on the face of the mold matrix between the mold matrix and a diamond film, said intermediate layer comprising:
     at least a single layer comprising a composition of at least one selected from: (a) metals of group IVA, VA and VIA of the periodic table (b) carbides, nitrides, carbontrides, carbonate nitrides, borides, borocarbides, and boronitrides of Si and Al and (c) carbides and nitrides of B (boron); and
     said diamond film having a (100) face formed a concentration of raw gas comprising hydrogenated and 1–3% methane and having a thickness within the range of 5 μm to 100 μm, wherein the (100) face is oriented parallel to the face of said mold matrix.

* * * * *

UNITED STATES PATENT AND TRADEMARK OFFICE
CERTIFICATE OF CORRECTION

PATENT NO. : 5,380,349
DATED : January 10, 1995
INVENTOR(S) : YASUSHI TANIGUCHI, ET AL.

It is certified that error appears in the above-identified patent and that said Letters Patent is hereby corrected as shown below:

ON TITLE PAGE

In [56] References Cited, under FOREIGN PATENT DOCUMENTS:
"52-45613  4/1979  Japan" should read
--52-45613  4/1977  Japan--.

In [57] ABSTRACT:
Line 9, ""There" should read --There--.
Line 11, "hydrogen."" should read --hydrogen.--.

COLUMN 1

Line 55, "Glass" should read --glass--.
Line 62, "Glass" should read --glass--.
Line 65, "Glass" should read --glass--.
Line 68, "Glass" (both occurrences) should read --glass--.

COLUMN 2

Line 1, "Generally" should read --generally--.
Line 4, "Glass" should read --glass--.
Line 25, "much" should read --many--.
Line 54, "to occur" should be deleted.
Line 55, "damage," should read --damage--.
Line 65, "diamond" should read --diamond,--.
Line 66, "temperature" should read --temperature,--.

COLUMN 3

Line 16, "method" should read --method is one--.
Line 17, "in which" should be deleted.
Line 39, "typically strength," should be deleted.

UNITED STATES PATENT AND TRADEMARK OFFICE
CERTIFICATE OF CORRECTION

PATENT NO. : 5,380,349

DATED : January 10, 1995

INVENTOR(S) : YASUSHI TANIGUCHI, ET AL.

It is certified that error appears in the above-identified patent and that said Letters Patent is hereby corrected as shown below:

COLUMN 4

Line 4, "are" should read --is--.
    Line 5, "according" should be deleted.
    Line 26, "the" should read --a--.
    Line 44, "33th" should read --33rd--.

COLUMN 5

Line 64, "task" should read --object--.

COLUMN 6

Line 34, "82 m" should read --µm--.

COLUMN 7

Line 34, "pressig" should read --pressing--.

COLUMN 9

Line 4, "lens" should read --a lens--.
    Line 7, "sphereical" should read --spherical--.

COLUMN 10

Line 6, "in," should be deleted.
    Line 38, "newly" should read --new-- and "timing" should read --time intervals--.

COLUMN 11

Line 56, "when" should read --when used--.

UNITED STATES PATENT AND TRADEMARK OFFICE
CERTIFICATE OF CORRECTION

PATENT NO. : 5,380,349
DATED : January 10, 1995
INVENTOR(S) : YASUSHI TANIGUCHI, ET AL.

It is certified that error appears in the above-identified patent and that said Letters Patent is hereby corrected as shown below:

COLUMN 14

Line 67, "by" should be deleted.

COLUMN 15

Line 43, "sphereical" should read --spherical--.

COLUMN 17

Line 55, "condidions" should read --contitions--.
Line 64, "little" should read --small--.

COLUMN 18

Line 31, "Rmax<0.01" should read --Rmax$\leq$0.01--.
Line 47, "substrate." should read --substrate 1.--.
Line 48, "made" should be deleted and "Ths" should read --The--.

COLUMN 19

Line 49, "sphereical" should read --spherical--.

COLUMN 20

Line 58, "Subsequenty," should read --Subsequently,--.

COLUMN 21

Line 5, "respectively, releasability" should read --respectively. Releasability--.

UNITED STATES PATENT AND TRADEMARK OFFICE
CERTIFICATE OF CORRECTION

PATENT NO. : 5,380,349
DATED : January 10, 1995
INVENTOR(S) : YASUSHI TANIGUCHI, ET AL.

It is certified that error appears in the above-identified patent and that said Letters Patent is hereby corrected as shown below:

<u>COLUMN 22</u>

Line 39, "a a" should read --a--.
Line 49, "table" should read --table,--.
Line 53, "formed" should read --formed by--.
Line 54, "hydroge-" should read --hydrogen--.
Line 55, "nated" should be deleted.

Signed and Sealed this

Sixth Day of June, 1995

Attest:

BRUCE LEHMAN

Attesting Officer        Commissioner of Patents and Trademarks